United States Patent
Agarwal

(12) 
(10) Patent No.: US 6,258,171 B1
(45) Date of Patent: Jul. 10, 2001

(54) DIRECT LIQUID INJECTION SYSTEM WITH ON-LINE CLEANING

(75) Inventor: Vishnu Kumar Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/491,590

(22) Filed: Jan. 25, 2000

Related U.S. Application Data

(62) Division of application No. 09/121,491, filed on Jul. 23, 1998.

(51) Int. Cl.[7] ................................................ C23L 16/00
(52) U.S. Cl. ................. 118/715; 118/726; 118/723 R; 118/723 ER; 118/723 IR; 118/723 ME
(58) Field of Search ..................... 118/715, 726, 118/723 R, 723 ER, 723 ME, 723 IR; 134/1.1, 1.2, 1.3

(56) References Cited

U.S. PATENT DOCUMENTS

| | | |
|---|---|---|
| 4,180,614 * | 12/1979 | Angelo et al. ..................... 428/336 |
| 4,900,694 | 2/1990 | Nakagawa . |
| 5,204,314 | 4/1993 | Kirlin et al. . |
| 5,361,800 | 11/1994 | Ewing . |
| 5,362,328 | 11/1994 | Gardiner et al. . |
| 5,371,828 | 12/1994 | Ewing . |
| 5,431,958 | 7/1995 | Desu et al. . |
| 5,470,390 * | 11/1995 | Nishikawa et al. .................. 118/719 |
| 5,472,505 | 12/1995 | Lee et al. . |
| 5,527,567 | 6/1996 | Desu et al. . |
| 5,553,188 | 9/1996 | Ewing . |
| 5,572,052 | 11/1996 | Kashihara et al. . |
| 5,595,603 | 1/1997 | Klinedinst et al. . |
| 5,616,208 * | 4/1997 | Lee ..................................... 156/345 |

(List continued on next page.)

FOREIGN PATENT DOCUMENTS

WO 009421840 A1  9/1994  (WO) .

OTHER PUBLICATIONS

Direct Liquid Injection Sub–System, Type DLI–25B, MKS Instruments, Jul. 1997.

Fab Bulletin 9706—Solving Uniformity Problems in a Tungsten Silicide CVD System, MKS Instruments, Aug. 1997.

Epler et al., Statutory Invention Registration No. H1264, published Dec. 1993.

*Primary Examiner*—Jeffrie R. Lund
(74) *Attorney, Agent, or Firm*—Killworth, Gottman, Hagan & Schaeff, L.L.P.

(57) ABSTRACT

A direct liquid injection system and process which has on-line cleaning of the vaporizers without the need for shutting down the CVD process and thus eliminating down time is provided. The cleaning process includes the steps of providing at least one metalorganic precursor to a first vaporizer to produce a vapor containing the at least one precursor; transporting the vapor to a deposition chamber; periodically interrupting the supply of the at least one metalorganic precursor to the first vaporizer; providing the at least one metalorganic precursor to a second vaporizer to produce a vapor containing the at least one precursor; transporting the vapor to the deposition chamber; and during at least a portion of the time when the supply of the metalorganic precursor is interrupted to the first vaporizer, providing a cleaning fluid (either liquid solvent or cleaning gas plasma) to the first vaporizer, which fluid is effective to at least partially remove deposits of the metalorganic precursor. The process may be either carried out as a batch process, or more preferably, as a continuous process to avoid the need to shut down the system.

8 Claims, 1 Drawing Sheet

U.S. PATENT DOCUMENTS

Figure 1:
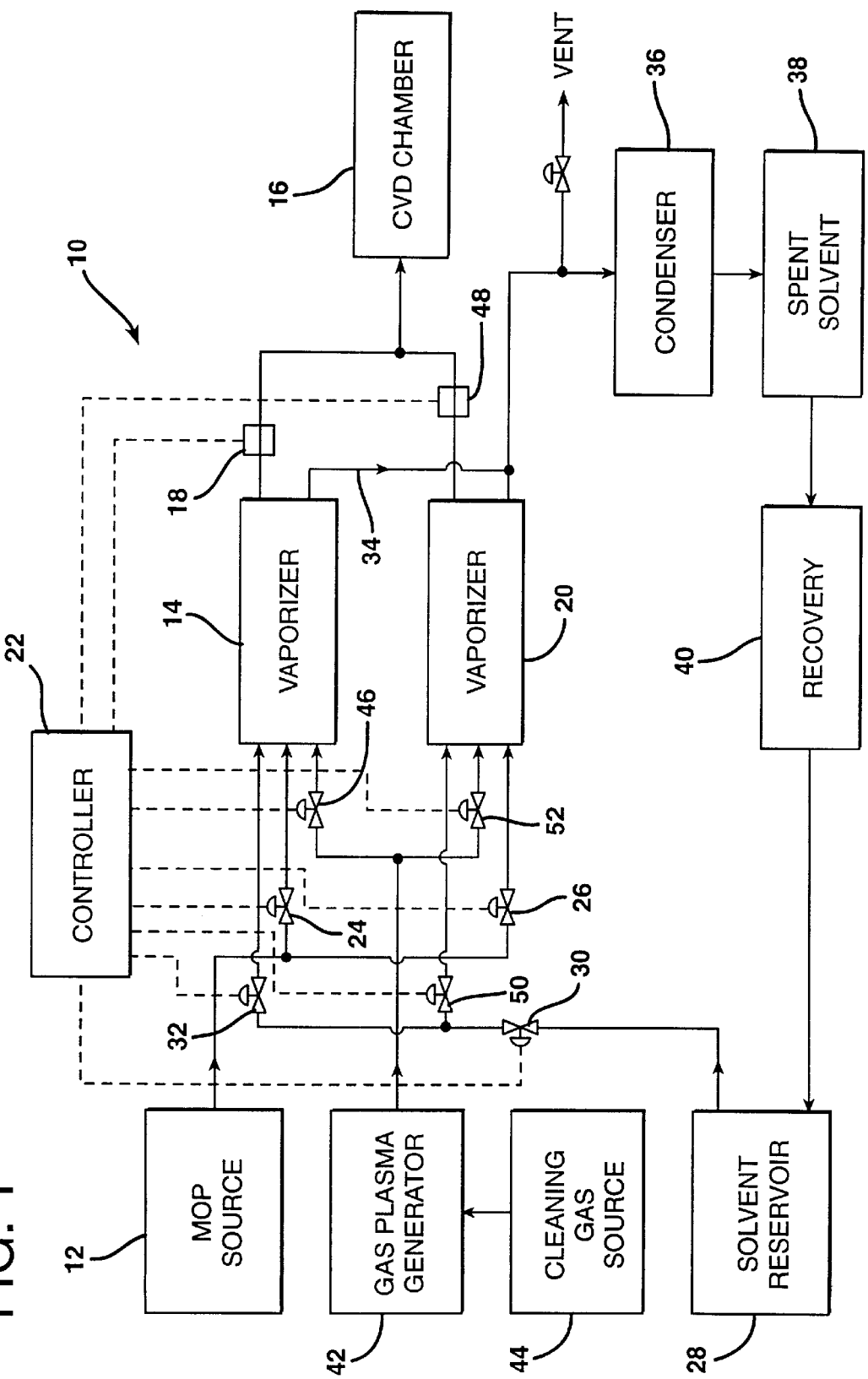

| | | |
|---|---|---|
| 5,629,229 | 5/1997 | Si et al. . |
| 5,690,743 * | 11/1997 | Murakami et al. .................. 118/715 |
| 5,876,503 | 3/1999 | Roeder et al. . |
| 5,882,416 | 3/1999 | Buskirk et al. . |
| 6,003,526 | 12/1999 | Lo et al. . |
| 6,056,823 * | 5/2000 | Sajoto et al. ......................... 118/715 |

* cited by examiner

DIRECT LIQUID INJECTION SYSTEM WITH ON-LINE CLEANING

CROSS-REFERENCE TO RELATED APPLICATIONS

This application is a division of U.S. patent application Ser. No. 09/121,491 filed Jul. 23, 1998.

This application is related to U.S. patent application Ser. No. 09/037,235, filed Mar. 10, 1998, the disclosure of which is hereby incorporated by reference.

BACKGROUND OF THE INVENTION

This invention relates to a direct liquid injection system which provides for on-line cleaning, and more particularly to a system and process for the controlled deposition of metal oxide layers using chemical vapor deposition techniques.

Semiconductor devices such as dynamic random access memories (DRAMs) have undergone substantial decreases in size and increases in charge storage density over the past several years, and it is expected that these trends will continue into the future. In order to increase capacity while decreasing size, DRAM designs have become increasingly complex. One problem has been the design of capacitors in the DRAM which will hold the necessary electrical charge representing stored data.

Oxides of silicon have conventionally been used as the dielectric materials in such DRAM capacitors. Silicon oxides, however, have relatively low dielectric constants and limited charge storage densities. Accordingly, there has been an effort in the art to identify materials having higher dielectric constants which are suitable for use in DRAM designs. Interest in ferroelectric materials such as barium strontium titanates ($Ba_{1-x}Sr_xTiO_3$, known as BSTs) and lead zirconate titanates ($Pb(Zr_xTi_{1-x})O_3$, known as PZTs) has grown because such materials have relatively higher dielectric constants than silicon oxides, are structurally stable, and can be prepared using known techniques.

Of the many chemical and physical deposition techniques used in the art to form thin film layers of such ferroelectric materials, metal organic chemical vapor deposition (MOCVD) using direct liquid injection appears to hold the most promise. For example, Desu et al, U.S. Pat. Nos. 5,431,958 and 5,527,567 teach MOCVD techniques, including direct liquid injection ('567 patent), to provided layered ferroelectric films for the manufacture of capacitors. Si et al, U.S. Pat. No. 5,629,229, also teach the manufacture of DRAMs using MOCVD techniques.

In MOCVD, the metalorganic precursors which are used are dissolved in liquid solvents which are then pumped in precise proportions to a vaporizer. The vaporized precursors are then sent to a CVD chamber where they are deposited on a substrate. The composition and properties of the deposited films of the ferroelectric materials are highly dependent on the ability of the direct liquid injection system to supply the correct proportions of precursors to the vaporizer and thence to the CVD chamber. Other variables in the system will also affect the composition and properties of the deposited films and include the condition of the vaporizer, the temperature of the vaporizing surfaces in the vaporizer, the concentrations of the metalorganic precursors in the solvent, and local temperature variations on the substrate surface in the reactor. The local temperature variations as well as accumulation of precursor compounds on the surfaces of the vaporizer both affect vaporization efficiency and can cause fluctuations in the composition and properties of the films which are deposited.

Such accumulations of precursor compounds and oxidative reaction products of the precursor compounds have the tendency to build-up over time and clog both the outlet to the vaporizer as well as the direct liquid injection mechanism. This leads not only to undesirable variations in the ratios of the precursor compounds which are deposited, but also to possible clogging and shutdown of the deposition process. To address these problems, Gardiner et al, U.S. Pat. No. 5,362,328, teach the use of a cleaning subsystem in a chemical vapor deposition process in which a solvent is supplied to the vaporizer to solubilize any deposited compounds and flush them away. However, the Gardiner et al cleaning subsystem requires that the CVD process be periodically shut down during the cleaning cycle. Accordingly, the need still exists in this art for a direct liquid injection system which provides for on-line cleaning without the need for shutting down the CVD process.

SUMMARY OF THE INVENTION

The present invention meets that need by providing a direct liquid injection system which has on-line cleaning of the vaporizers without the need for shutting down the CVD process, and thus eliminating down time. The present invention also provides alternative sources of cleaning fluid which may be selected to remove metalorganic precursor and oxidation product residues which are deposited in the vaporizers.

In accordance with one aspect of the present invention, a process for the on-line cleaning of a direct liquid injection system is provided and includes the steps of providing at least one metalorganic precursor to a first vaporizer to produce a vapor containing the at least one precursor; transporting the vapor to a deposition chamber; periodically interrupting the supply of the at least one metalorganic precursor to the first vaporizer; providing the at least one metalorganic precursor to a second vaporizer to produce a vapor containing the at least one precursor; transporting the vapor to the deposition chamber; and during at least a portion of the time when the supply of the metalorganic precursor is interrupted to the first vaporizer, providing a cleaning fluid to the first vaporizer, which fluid is effective to at least partially remove deposits of the metalorganic precursor and oxidation products. Preferably, the cleaning fluid is effective to remove substantially all of the deposits and residue of the at least one metalorganic precursor and any oxidation products which may have formed.

The process may be either carried out as a batch process, or more preferably, as a continuous process. Thus, when the supply of metalorganic precursor is interrupted to the first vaporizer for cleaning, the supply to the second vaporizer is initiated so that there is a continuous flow of vaporized precursor being supplied to the deposition chamber. That supply of metalorganic precursor is maintained to the second vaporizer until a buildup of deposits or residue is detected. Then the procedure is reversed by resuming the supply of the at least one metalorganic precursor to the first vaporizer and interrupting the supply of the at least one metalorganic precursor to the second vaporizer. During at least a portion of the time when the supply of the metalorganic precursor is interrupted to the second vaporizer, a cleaning fluid is provided to the second vaporizer, which fluid is effective to at least partially remove deposits of the metalorganic precursor and oxidation products, and preferably, is effective to substantially completely remove deposits and residues of the metalorganic precursor and any oxidation products which may have formed.

In a preferred form, the at least one metalorganic precursor is dissolved in a liquid solvent carrier which is supplied to the vaporizers. The cleaning fluid may comprise a liquid solvent for the at least one metalorganic precursor. The cleaning fluid may be recovered and recycled after it has been passed through the vaporizer. Alternatively, the cleaning fluid may comprise a gas plasma which is an etchant for the deposits of metalorganic precursor and oxidation products. The gas plasma may be formed in a conventional manner, such as, for example, using microwave energy to form the plasma. The gas plasma is formed from an etchant gas which is preferably selected from the group consisting of $NF_3$, $ClF_3$, and HF. The plasma is formed at a temperature and at a pressure which permits it to be sufficiently long-lived to effect its cleaning function in the vaporizers.

Additionally, the vaporizer may be cleaned by sequentially supplying different cleaning fluids to it. Thus, the vaporizer may be cleaned by first using a gas plasma which is then followed by a solvent-containing fluid. Alternatively, the vaporizer may be cleaned by first using a solvent-containing cleaning fluid which is followed by a gas plasma treatment.

The step of monitoring the build up of deposits in the first vaporizer and interrupting the supply of the metalorganic precursor is preferably designed to operate when such buildup reaches a predetermined level. The degree of buildup of metalorganic precursor deposits may be measured by monitoring the flow rate of the vapor from the first vaporizer. When such flow rate drops below a predetermined level, the supply of metalorganic precursor is interrupted, and cleaning fluid is sent to the vaporizer.

The present invention also provides an apparatus for a direct liquid injection system with on-line cleaning which includes a source of at least one metalorganic precursor; first and second vaporizers for the at least one metalorganic precursor; a chemical vapor deposition chamber for receiving vaporized metalorganic precursor; a source of cleaning fluid for removing deposits of the at least one metalorganic precursor from the first and second vaporizers; and a controller for directing the at least one metalorganic precursor to either the first or second vaporizer, for periodically interrupting the flow of the at least one metalorganic precursor to the first or second vaporizer, and for initiating a flow of the cleaning fluid to the vaporizer which has had its supply of metalorganic precursor interrupted. The system also preferably includes monitors in or adjacent to the first and second vaporizers for monitoring the build up of deposits of the at least one metalorganic precursor. The monitors may comprise flow rate measurement devices.

In a preferred form, a valve is positioned between the source of the at least one metalorganic precursor and the first vaporizer, and another valve is positioned between the source of the at least one metalorganic precursor and the second vaporizer. The controller regulates the operation of the valves by feedback control from the monitors.

The present invention has the advantage of being able to operate continuously while providing cleaning fluids which are suitable and effective to remove even the most difficult to remove deposits and residues of the metalorganic precursors and any oxidation products which may have formed. These and other features and advantages of the invention will become apparent from the following detailed description, the accompanying drawings, and the appended claims.

BRIEF DESCRIPTION OF THE DRAWING FIGURE

The single drawing figure depicts, in schematic form, a preferred configuration for the direct liquid injection system of the present invention.

DETAILED DESCRIPTION OF THE PREFERRED EMBODIMENTS

The present invention provides a system and process for using direct liquid injection to deposit single or multicomponent oxide films on semiconductor devices. Examples of multicomponent oxides include, but are not limited to, barium strontium titanate (BST), bismuth strontium tantalum oxide (SBT), lead zirconate titanate (PZT), and lanthanum lead zirconate titanate (PLZT). These ferroelectric materials exhibit high dielectric constants and low current leakage, are chemically and physically stable, and can be deposited in a dense film at high deposition rates using conventional techniques to provide good step coverage of substrates. As such, these materials find use in capacitor structures in semiconductor devices such as random access memories as well as in other devices using ferroelectric materials including pyroelectric detectors, ultrasonic sensors, and electro-optic devices including optical switches and optical displays. As used herein, the term "substrate" means any material with sufficient load-bearing capability and internal strength to withstand the application of a layer or layers of additional materials during a fabrication process. As used herein, the term encompasses silicon structures such as silicon wafers and semiconductor devices, including semiconductor devices in the process of fabrication. The term "silicon wafer" means either the lowest layer of semiconductor material in a wafer or a wafer having additional layers or structures formed thereon.

The metalorganic precursors used in the practice of the present invention are preferably alkyls, alkoxides, β-diketonates, or metallocenes of the corresponding metal elements which make up the multicomponent metal oxide films. Suitable metalorganic precursors for use in a MOCVD process include those compounds which exhibit high vapor pressure at low vaporization temperatures, low decomposition temperatures, a large "window" between vaporization and decomposition temperatures, no contamination from organic constituents of the precursors, stability under ambient conditions, and nontoxicity. These properties of the precursors may be modified and adjusted to some extent by the choice of the particular organic substituents. For example, volatility of a metal β-iketonate can be varied by varying the alkyl group to which it is attached.

As shown in the drawing Figure, the system 10 includes a source 12 of at least one metalorganic precursor. While a single source is shown for purposes of illustration, it will be appreciated that the number of precursors may vary depending upon the particular metal oxide film which is to be formed. For example, there may be three or more separate sources of different metalorganic precursors. In such a case, as described in commonly-assigned copending U.S. patent application Ser. No. 09/037,235, filed Mar. 10, 1998, the disclosure of which is hereby incorporated by reference, the individual metalorganic precursors are preferably supplied in liquid form by dissolving them in suitable liquid carriers. The separate streams of liquid precursors are then mixed prior to being supplied to the vaporizer. Suitable solvent carriers for metalorganic compounds include tetrahydrofuran ($C_4H_8O$), isopropanol ($C_3H_7OH$), tetraglyme ($C_{10}H_{22}O_5$), and mixtures thereof. Typically, the concentration of metalorganic precursors in the solvent carrier will be between about 0.01 to about 1.0 mole per liter of solvent.

The metalorganic precursor, or blend of metalorganic precursors, is sent to first vaporizer 14. Vaporizer 14 is preferably one which can quickly heat the precursor (preferably to at least 250° C.) and efficiently cause the precursor and liquid carrier to flash vaporize. One suitable vaporizer is commercially available from MKS Instruments of Andover, Md. and utilizes heated metal disks. Vaporizer 14 may also include a port (not shown) for mixing an inert gas such as nitrogen with the vaporized precursor to carry it into the chemical vapor deposition chamber. The inert gas which is supplied to vaporizer 14 may also be used to vary the composition, and thus the vaporizing characteristics, of the precursor.

After vaporization, the metalorganic precursor is sent to chemical vapor deposition (CVD) chamber 16. Chamber 16 may be either a hot wall or cold wall MOCVD reactor of the type conventionally used in this art. A substrate (not shown) is placed into chamber 16 which is heated to a temperature of between about 300° to 800° C. and maintained at a pressure of between about $1.0 \times 10^{-4}$ to 100 torr. In chamber 16, the vaporized metalorganic precursor(s) decompose and are deposited as single or multi-component metal oxides on the surface of the substrate. Typically, multi-component oxide films are deposited to a thickness of from between about 10 to about 1000 Å, and more preferably from about 50 to about 300 Å. Such deposition takes from about 30 seconds to about 20 minutes, and more typically from about 1 to 2 minutes.

While the system is designed to supply precise quantities of metalorganic precursors to vaporizer 14, and thence to chamber 16, because of the conditions in vaporizer 14, there is a tendency for the metalorganic precursor to deposit and solidify on the surfaces of the vaporizer. Further, some oxidation products of the precursor may have formed as well. Accumulation of precursor and oxidation compounds on the surfaces of the vaporizer, including the injector and vapor outlet, both affect vaporization efficiency and can cause fluctuations in the composition and properties of the films which are deposited.

To insure that the vaporized precursor stream continuously supplies the correct amount of vaporized precursor to chamber 16 for deposition and, for multicomponent embodiments, maintains its desired stoichiometric ratio of components, the vaporized stream is continuously (or intermittently) monitored by monitoring device 18 which, in the illustrated embodiment, is located downstream from first vaporizer 14. It will be appreciated, however, that depending on the particular type of monitoring device, the device may be located in or adjacent to the vaporizer. Monitoring device 18 may monitor any of a number of physical or process parameters of the vaporized precursor stream. A suitable monitoring device is a flow rate monitor for measuring the volumetric flow rate of the precursor. Monitor 18 supplies information to a controller 22. Controller 22 may be either a programmable logic controller or a programmable general purpose computer.

When that flow rate is measured to have dropped below a predetermined value, the drop in flow indicates a buildup of deposits and/or residues on the surfaces of the vaporizer. In the prior art, such a buildup necessitated the shutdown of the system for periodic cleaning of the vaporizer surfaces. However, the system of the present invention is preferably designed to operate continuously. For that purpose, a second vaporizer 20 is provided. When monitor 18 supplies information to controller 22 which indicates such a buildup, controller 22 acts to interrupt the flow of metalorganic precursor to first vaporizer 14 by closing valve 24. Simultaneously, controller 22 opens valve 26 to redirect the supply of metalorganic precursor(s) to second vaporizer 20. Controller 22 may also at this time, or a later point in time, begin the cleaning cycle for first vaporizer 14 to remove the buildup of deposits and/or residues. A cleaning fluid in the form of either a gas or a liquid may be utilized. For example, a liquid solvent for the metalorganic precursor(s) and oxidation products may be stored in reservoir 28 and its flow to first vaporizer 14 may be initiated by opening valves 30 and 32, respectively. A series of pumps (not shown) insures the proper flow of all components through the system. The solvents may be the same solvents described above as carriers for the metalorganic precursor(s). Spent solvent, along with the metalorganic precursor deposits and residues which have been removed from vaporizer 14, is taken from first vaporizer 14 through line 34 and condenser 36 to spent solvent reservoir 38. The spent solvent may either be disposed of or sent to a recovery station 40 where impurities and contaminants are removed from the solvent, and the solvent is recycled to solvent reservoir 28 for reuse.

Alternatively (or in addition to the use of liquid solvent), the cleaning fluid may be a gas plasma using a cleaning gas which is an etchant for the metalorganic precursor deposits and residues in the vaporizer. It has been found that a cleaning gas plasma is effective to react with and remove deposits which are difficult to remove completely using liquid solvents. The gas plasma is generated in generator 42 using a cleaning gas from source 44. Controller 22 opens valve 46 to initiate the flow of plasma to vaporizer 14. Thus, the present invention contemplates that the vaporizer may be cleaned using a liquid solvent, a gas plasma, or a sequence in which both cleaning fluid are utilized in series.

The gas plasma may be formed in a conventional manner, such as, for example, using microwave energy to form the plasma. The gas plasma is formed from an etchant gas which is preferably selected from the group consisting of $NF_3$, $ClF_3$, and HF. The plasma is formed at a temperature and at a pressure which permits it to be sufficiently long-lived to effect its cleaning function in the vaporizers. The spent gas plasma and removed deposits of metalorganic precursor(s) are sent through line 34 for disposal or recovery.

Once the deposits and residues are cleaned from vaporizer 14, controller 22 shuts off the flow of cleaning fluid. The flow of vaporized metalorganic precursor from second vaporizer 20 is monitored by monitoring device 48, located downstream from second vaporizer 20, which reports information to controller 22. Once a buildup of deposits in second vaporizer 20 is detected, controller 22 resumes the supply of metalorganic precursor to first vaporizer 14, and interrupts the flow of metalorganic precursor to second vaporizer 20. Then, the cleaning cycle for second vaporizer 20 is initiated by beginning the flow of either liquid solvent from reservoir 28 by opening valve 50, or, alternatively, gas plasma is introduced into second vaporizer 20 by opening valve 52. The cleaning cycle for second vaporizer is as was previously described with respect to first vaporizer 14.

Thus, the system and process of the present invention may be operated in a batch process. However, most preferably, the process and system are operated to provide a continuous supply of vaporized metalorganic precursor species to CVD chamber 16. This is accomplished by providing on-line cleaning of vaporizer chambers while maintaining the flow of metalorganic precursor to the CVD chamber.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for a direct liquid injection system with on-line cleaning comprising:

a source of at least one metalorganic precursor;

first and second vaporizers for said at least one metalorganic precursor;

a chemical deposition chamber for receiving vaporized metalorganic precursor;

a source of cleaning fluid for removing deposits of said at least one metalorganic precursor from said first and second vaporizers; and A controller for directing said at least one metalorganic precursor to either said first or second vaporizer, for periodically interrupting the flow of said at least one metalorganic precursor to said first or second vaporizer, for redirecting said at least one metalorganic precursor to the other of said first or second vaporizers, and for initiating a flow of said cleaning fluid to the vaporizer which has had its supply of metalorganic precursor interrupted.

2. An apparatus as claimed in claim 1 in which said source of cleaning fluid comprises a liquid solvent.

3. An apparatus as claimed in claim 1 in which said source of cleaning fluid comprises a gas plasma.

4. An apparatus as claimed in claim 3 including monitors in or adjacent to said first and second vaporizers for monitoring the build up of deposits of said at least one metalorganic precursor.

5. An apparatus as claimed in claim 4 in which said monitors comprise flow rate measurement devices.

6. An apparatus as claimed in claim 4 in which said monitors communicate with said controller.

7. An apparatus as claimed in claim 1 including a valve positioned between said source of said at lest one metalorganic precursor and said first vaporizer and a valve positioned between said source of said at least one metalorganic precursor and said second vaporizer.

8. An apparatus as claimed in claim 7 in which said controller regulates the operation of said valves.

* * * * *